(12) United States Patent
Inamori et al.

(10) Patent No.: US 7,834,700 B2
(45) Date of Patent: Nov. 16, 2010

(54) RADIO FREQUENCY POWER AMPLIFIER

(75) Inventors: Masahiko Inamori, Osaka (JP); Kazuki Tateoka, Kyoto (JP); Hirokazu Makihara, Osaka (JP); Shingo Matsuda, Kyoto (JP); Junji Kaido, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/535,309

(22) Filed: Aug. 4, 2009

(65) Prior Publication Data
US 2010/0127781 A1 May 27, 2010

(30) Foreign Application Priority Data
Nov. 21, 2008 (JP) .............................. 2008-298630

(51) Int. Cl.
*H03F 3/68* (2006.01)
(52) U.S. Cl. .................................. 330/295; 330/124 R
(58) Field of Classification Search ................. 330/295, 330/124 R, 84, 126
See application file for complete search history.

(56) References Cited

U.S. PATENT DOCUMENTS

| 5,398,004 | A | 3/1995 | Kobayashi |
| 5,608,353 | A | 3/1997 | Pratt |
| 5,710,523 | A | 1/1998 | Kobayashi |
| 6,333,677 | B1 | 12/2001 | Dening |
| 6,853,245 | B2 * | 2/2005 | Kim et al. ................ 330/124 R |
| 7,449,957 | B2 * | 11/2008 | Enomoto et al. ............ 330/295 |
| 7,548,118 | B2 * | 6/2009 | Ariie et al. .................. 330/295 |

FOREIGN PATENT DOCUMENTS

| JP | 2003-243942 A | 8/2003 |
| JP | 2003-324325 A | 11/2003 |
| JP | 2007-288736 A | 11/2007 |

* cited by examiner

*Primary Examiner*—Henry K Choe
(74) *Attorney, Agent, or Firm*—McDermott Will & Emery LLP

(57) ABSTRACT

A radio frequency signal is input to the bases of transistors via respective capacitors, is amplified, and is output from the collectors of the transistors. The emitter of each transistor is grounded. A bias current input from a bias circuit is supplied to the bases of the transistors via respective resistors both during low-output operation and during high-output operation. The collectors of the transistors are connected via an impedance circuit to a bias voltage input terminal. Therefore, during high-output operation, a direct current offset voltage is generated by the impedance circuit based on a portion of a radio frequency signal output from the collectors, thereby further increasing the bias current.

13 Claims, 13 Drawing Sheets

RADIO FREQUENCY POWER AMPLIFIER

CROSS REFERENCE TO RELATED APPLICATION

This application claims priority to Japanese Patent Application No. 2008-298630 filed on Nov. 21, 2008, the disclosure of which including the specification, the drawings, and the claims is hereby incorporated by reference in its entirety.

BACKGROUND

The present disclosure relates to a radio frequency power amplifier for power amplification of a radio frequency signal.

A digital mobile telephone terminal includes a multimode system which allows the terminal to be used in many parts of the world (e.g., GSM: Global System for Mobile communications, UMTS: Universal Mobile Telecommunications System). In the mobile telephone terminal, a power amplifier for high-output power amplification is provided in which, typically, two or three compound semiconductor transistors for radio frequency amplification are connected in a linear fashion. As the compound semiconductor transistor, for example, a heterojunction bipolar transistor (HBT) made of GaAs is used, in view of single positive power supply operation or the like. In recent years, in view of a reduction in size of the mobile telephone terminal, there has been progress in developing a multimode power amplifier which can be used in multiple modes.

The power amplifier in the mobile telephone terminal has more than about half the power consumption of the mobile telephone terminal, and therefore, it is essential to enable the power amplifier to operate with low power consumption so as to increase the talk time of the mobile telephone terminal.

The output power of the power amplifier is generally about +34 dBm in the GSM standard, and within the wide range of about +27 dBm to about −50 dBm in the UMTS standard. Particularly, the power consumption is highest in the vicinity of the highest output power, i.e., +34 dBm (GSM) or +27 dBm (UMTS). Therefore, it is necessary to suppress the power consumption in this vicinity.

A final-stage amplifier of amplifiers for a mobile telephone having an output power of about 300 mW to about 3 W has a configuration in which a plurality of transistors are connected in parallel and the outputs of the transistors are combined, so as to obtain radio frequency characteristics and a high output. An example configuration of such a conventional radio frequency power amplifier is shown in FIG. 13 (see Patent Documents 1 to 4).

In the conventional radio frequency power amplifier 100 of FIG. 13, a direct-current bias voltage input from a bias circuit B1 to a bias voltage input terminal DCIN is supplied to the bases of transistors Q101 to Q10$n$ via respective resistors Ra101 to Ra10$n$, where n is an integer of 2 or more. Also, a radio frequency signal input to a radio frequency signal input terminal RFIN is supplied to the bases of the transistors Q101 to Q10$n$ via respective capacitors C101 to C10$n$. The collectors of the transistors Q101 to Q10$n$ are commonly connected and coupled to a radio frequency signal output terminal RFOUT. The emitters of the transistors Q101 to Q10$n$ are each grounded (see Patent Documents 1, 2 and 4).

The bias circuit B1 of FIG. 13 includes a transistor Q0 whose collector is connected to a power supply VDC and performs emitter follower operation, and a temperature compensation circuit T1 which is connected to a power supply VREF. The temperature compensation circuit T1 includes a resistor R0, and diodes D1 and D2 (see Patent Document 3).

A reason why a bias voltage and a radio frequency signal are input to the bases of the transistors Q101 to Q10$n$ via respective different paths as shown in FIG. 13, is as follows. Specifically, when the transistors Q101 to Q10$n$ perform high-output operation, the current density of alternating current increases, resulting in heat generation. The generated heat is not uniform in all of the transistors Q101 to Q10$n$ due to variations in characteristics between the transistors Q101 to Q10$n$. Therefore, a specific transistor whose temperature becomes high is likely to run away due to a large amount of heat generated during operation, resulting in an increase in base current, which leads to device breakdown. Therefore, in order to suppress the thermal runaway, when the base voltages of the transistors Q101 to Q10$n$ increase, the values of the resistors Ra101 to Ra10$n$ are increased so as to reduce the base bias current supplied from the bias circuit B1.

On the other hand, in the UMTS standard, a Probability Density Function (PDF) indicating the frequency of use in the output power of the power amplifier is highest within the range of +5 dBm to +15 dBm with its peak being located in the vicinity of a relatively low output of +10 dBm. Although the power consumption is not very high when the output power is within this range as compared to that during the highest-output operation, it is important to reduce the power consumption as well, since the frequency of use is high. Therefore, in the mobile telephone terminal, a DC-DC converter is used to control the collector voltage of the power amplifier within the range of 1.0 V to 3.35 V. Particularly, when the output power is +15 dBm or less, the collector voltage is set to 1.0 V so as to reduce the power consumption. Moreover, since a collector current in the vicinity of a low output also has a significant influence on the power consumption of the power amplifier, the current of the bias circuit B1 needs to be set to be as low as possible.

In the conventional radio frequency power amplifier 100 of FIG. 13, a capacitor CZ1 is coupled between the bias voltage input terminal DCIN and the radio frequency signal input terminal RFIN in addition to the aforementioned configuration, whereby gain compression accompanying an increase in input radio frequency signal can be suppressed, resulting in low distortion operation of the radio frequency power amplifier 100. As a result, the current of the bias circuit B1 is set to be low while a high output is achieved, i.e., satisfactory radio frequency characteristics are achieved (see Patent Document 2).

Patent Document 1: U.S. Pat. No. 5,608,353
Patent Document 2: Japanese Unexamined Patent Application Publication No. 2003-324325
Patent Document 3: Japanese Unexamined Patent Application Publication No. 2007-288736
Patent Document 4: Japanese Unexamined Patent Application Publication No. 2003-243942

SUMMARY

In the conventional radio frequency power amplifier 100, the values of the resistors Ra101 to Ra10$n$ are set to be high, thereby suppressing the thermal runaway of the transistors Q101 to Q10$n$ and achieving uniform operation thereof.

However, the high values of the resistors Ra101 to Ra10$n$ promote the suppression of the base bias current supplied from the bias circuit B1, leading to a decrease in power gain during high-output operation, in part because the current of the bias circuit B1 is set to be low so as to suppress the power consumption during low-output operation. Therefore, the resistors Ra101 to Ra10$n$ cannot be set to very high values. In other words, there is a trade-off between the uniform operation of the transistors Q101 to Q10n improved by increasing the values of the resistors Ra101 to Ra10n (an improvement in resistance to breakdown), and the radio frequency power gain during high-output operation of the transistors Q101 to Q10n improved by decreasing the values of the resistors Ra101 to Ra10n (an improvement in radio frequency characteristics), i.e., it is difficult to simultaneously achieve both of them.

On the other hand, by setting the current of the bias circuit B1 to be high, the suppression of the base bias current due to an increase in the values of the resistors Ra101 to Ra10n can be relaxed, thereby suppressing the power gain reduction during high-output operation to some extent. However, it is difficult to improve the radio frequency power gain during sufficiently high-output operation (an improvement in radio frequency characteristics). Moreover, in this case, the current consumption during low-output operation increases. In other words, when the values of the resistors Ra101 to Ra10n are increased, there is a trade-off between the radio frequency power gain during high-output operation of the transistors Q101 to Q10n improved by setting the current of the bias circuit B1 to be high (an improvement in radio frequency characteristics), and the power consumption during low-output operation of the transistors Q101 to Q10n improved by setting the current of the bias circuit B1 to be low (an improvement in radio frequency characteristics), i.e., it is difficult to simultaneously achieve both of them.

Therefore, an object of the present disclosure is to provide a radio frequency power amplifier which simultaneously achieves sufficient resistance to breakdown, and satisfactory radio frequency characteristics during high-output operation and satisfactory radio frequency characteristics during low-output operation.

The present disclosure is directed to a radio frequency power amplifier for power amplification of a radio frequency signal. To achieve the object, a radio frequency power amplifier according to an embodiment of the present disclosure includes: a plurality of transistors connected in parallel and each having a grounded emitter; a plurality of first resistors each having a first terminal and a second terminal, where a direct current bias voltage is commonly applied to all of the first terminals, and the second terminals are connected to bases of the respective transistors; a plurality of first capacitors each having a first electrode and a second electrode, where the radio frequency signal is input to all of the first electrodes, and the second electrodes are connected to the bases of the respective transistors; and one or more impedance circuits each having a first terminal and a second terminal, where the direct current bias voltage is commonly applied to all of the first terminals, and the second terminals are connected to collectors of the respective transistors. The impedance circuit conducts a direct-current component. The radio frequency power amplifier may further include a plurality of second capacitors each having a first electrode and a second electrode, where the direct current bias voltage is commonly applied to all of the first electrodes, and the second electrodes are connected to the bases of the respective transistors.

The direct current bias voltage input to the bases of the plurality of transistors is supplied from a bias circuit having, for example, an emitter follower in an output configuration thereof during low-output operation, and is supplied from the bias circuit and the impedance circuit during high-output operation.

Note that the impedance circuit includes, for example, a circuit in which a base-emitter diode obtained by creating a short-circuit between the base and collector of a transistor, and a resistor are connected in series.

According to the present disclosure, one or more impedance circuits are provided in a radio frequency power amplifier including a plurality of transistors connected in parallel, thereby making it possible to simultaneously achieving sufficient resistance to breakdown, and radio frequency characteristics during high-output operation and satisfactory radio frequency characteristics during low-output operation.

DETAILED DESCRIPTION

Hereinafter, embodiments of the present disclosure will be described with reference to the accompanying drawings. Like parts are indicated by like reference symbols and will not be repeatedly described.

Embodiment 1

Figure 1:
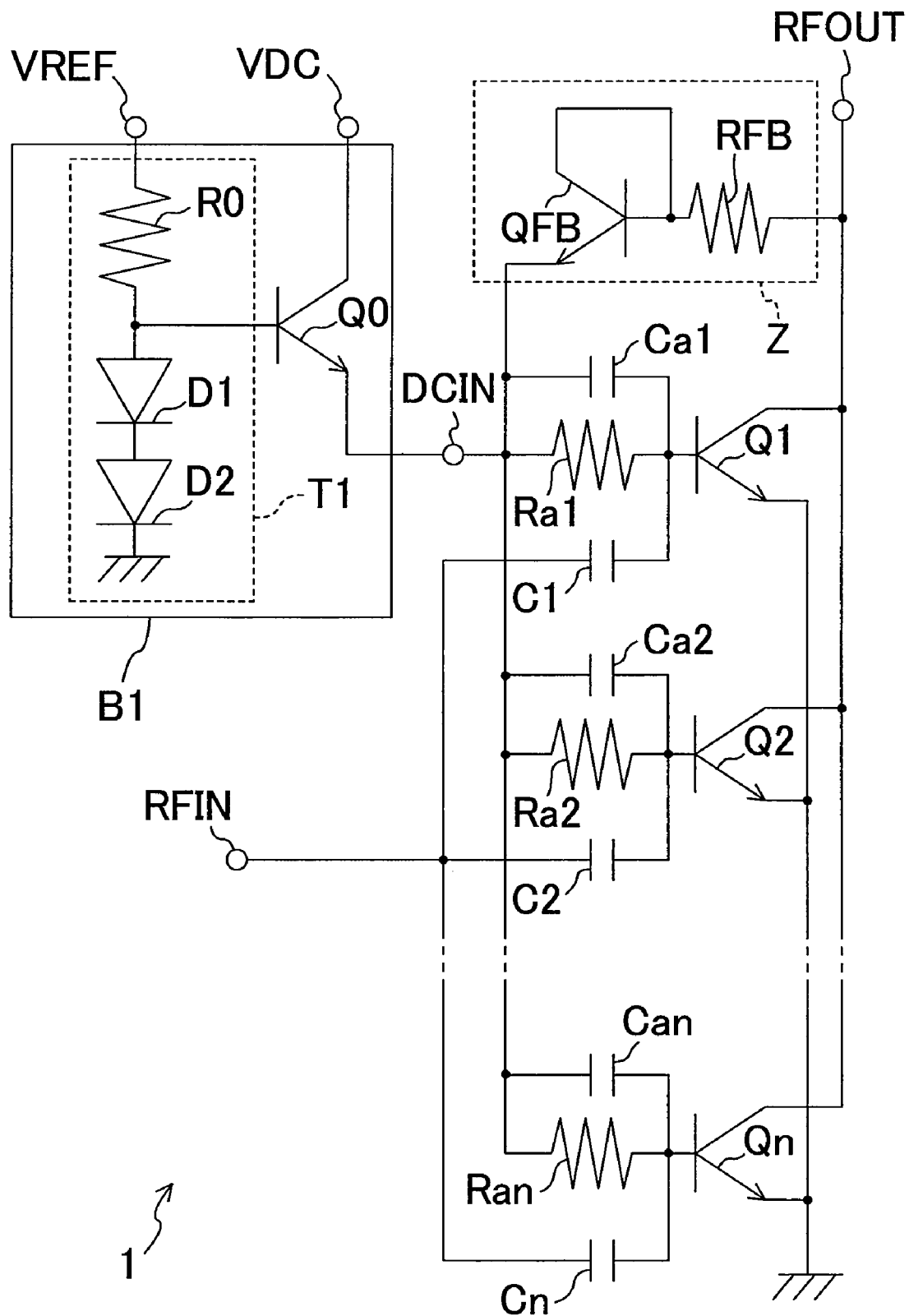
FIG. 1 is a diagram showing a circuit configuration of a radio frequency power amplifier according to Embodiment 1 of the present disclosure.

FIG. 1 is a diagram showing a circuit configuration of a radio frequency power amplifier according to Embodiment 1 of the present disclosure. The radio frequency power amplifier 1 of FIG. 1 includes transistors Q1 to Qn, capacitors C1 to Cn, resistors Ra1 to Ran, capacitors Ca1 to Can, and an impedance circuit Z. The impedance circuit Z conducts a direct current component. Here, n is an integer of 2 or more.

A radio frequency signal supplied to a radio frequency signal input terminal RFIN is input to the bases of the transistors Q1 to Qn via the respective capacitors C1 to Cn, and is amplified and output from the collectors of the transistors Q1 to Qn to a radio frequency signal output terminal RFOUT. The emitters of the transistors Q1 to Qn are each grounded. A direct-current bias voltage input from a bias circuit B1 to a bias voltage input terminal DCIN is supplied to the bases of the transistors Q1 to Qn via the respective resistors Ra1 to Ran both during high-output operation and during low-output operation.

On the other hand, the collectors of the transistors Q1 to Qn are connected via the impedance circuit Z to the bias voltage input terminal DCIN. FIG. 1 also shows an example configuration of the impedance circuit Z. The impedance circuit Z of FIG. 1 includes a resistor RFB, and a base-emitter diode which is obtained by creating a short-circuit between the base and collector of a transistor QFB, which are connected in series, and therefore, conducts a direct-current component. As a result, a direct-current bias voltage extracted from the collectors of the transistors Q1 to Qn is interrupted during low-output operation in which the collector voltage is set to be low, and is supplied to the impedance circuit Z, and to the bases of the transistors Q1 to Qn via the respective resistors Ra1 to Ran, during high-output operation in which the collector voltage is set to be high. Also, a portion of the radio frequency signal output extracted from the collectors of the transistors Q1 to Qn is fed back to the impedance circuit Z, and to the bases of the transistors Q1 to Qn via the respective resistors Ra1 to Ran and the respective capacitors Ca1 to Can.

The configuration of the bias circuit B1 is not particularly limited as long as the bias circuit B1 can supply a bias voltage. Note that FIG. 1 shows a preferable configuration of the bias circuit B1. The bias circuit B1 of FIG. 1 includes a transistor Q0 whose collector is connected to a power supply VDC so that the transistor Q0 performs an emitter follower operation, and a temperature compensation circuit T1 connected to a power supply VREF. The temperature compensation circuit T1 includes a resistor R0 and diodes D1 and D2. As each of the diodes D1 and D2, a base-emitter diode which is obtained by creating a short-circuit between the base and collector of a transistor, may be used so as to compensate for the sum of base-emitter voltages between the transistors Q1 to Qn of the radio frequency power amplifier 1 and the transistor Q0 of the bias circuit B1.

In the radio frequency power amplifier 1 of Embodiment 1 having the aforementioned configuration, a direct current bias voltage in a low-output operation region (+15 dBm or less) is set as follows. Specifically, the collector voltage of each of the transistors Q1 to Qn is set to be lower than 2.5 V (e.g., 1.0 V, etc.) so as to reduce power consumption. A bias current from the bias circuit B1 is input via the resistors Ra1 to Ran to the bases of the transistors Q1 to Qn. Since the base-emitter diode obtained by creating a short-circuit between the base and collector of the transistor QFB in the impedance circuit Z is in the OFF state (the HBT made of GaAs is in the ON state when the base-emitter voltage is 1.2 V or more), a bias current is not supplied from the impedance circuit Z. On the other hand, a radio frequency signal input from the radio frequency signal input terminal RFIN is input via the capacitors C1 to Cn to the bases of the transistors Q1 to Qn, is power-amplified, and is output from the collectors of the transistors Q1 to Qn.

In a high-output operation region (in the vicinity of +34 dBm), the direct current bias voltage is set as follows. Specifically, the collector voltage of each of the transistors Q1 to Qn is set to be higher than 2.5 V (e.g., 3.35 V, etc.), corresponding to high-output operation. Since the base-emitter diode obtained by creating a short-circuit between the base and collector of the transistor QFB in the impedance circuit Z is in the ON state (the HBT made of GaAs is in the ON state when the base-emitter voltage is 1.2 V or more), a bias current from the impedance circuit Z as well as a bias current from the bias circuit B1 are supplied to the bias voltage input terminal DCIN. The addition of these bias currents is input via the paths of the resistors Ra1 to Ran to the bases of the transistors Q1 to Qn. On the other hand, a radio frequency signal input from the radio frequency signal input terminal RFIN is input via the capacitors C1 to Cn to the bases of the transistors Q1 to Qn, is power-amplified, and is output from the collectors of the transistors Q1 to Qn. By providing the impedance circuit Z, a portion of a radio frequency signal output from the collectors of the transistors Q1 to Qn is input via the resistor RFB to the base of the transistor QFB, and is fed back to the bases of the transistors Q1 to Qn via the resistors Ra1 to Ran and the capacitors Ca1 to Can.

The voltage amplitude of the radio frequency signal output fed back to the impedance circuit Z is clipped at a timing when the base-emitter diode of the transistor QFB is turned ON (negative amplitude), and is not clipped at a timing when the base-emitter diode of the transistor QFB is turned OFF (positive amplitude), due to the nonlinearity of the base-emitter diode of the transistor QFB. Therefore, a direct current offset voltage having positive polarity is generated at the bias voltage input terminal DCIN. The effect of generation of the direct current offset voltage is more significant as the radio frequency signal output fed back from the collectors of the transistors Q1 to Qn increases.

The radio frequency signal from the radio frequency signal input terminal RFIN is input via the capacitors C1 to Cn to the bases of the transistors Q1 to Qn. Moreover, a portion of the radio frequency signal is input via the resistors Ra1 to Ran, the capacitors Ca1 to Can and the bias voltage input terminal DCIN to the bias circuit B1 and the impedance circuit Z. Particularly, the radio frequency signal is easily passed since the capacitors Ca1 to Can are provided.

The voltage amplitude of the radio frequency signal input from the radio frequency signal input terminal RFIN to the bias circuit B1 is clipped at a timing when the base-emitter diode of the transistor Q0 is turned ON (negative amplitude), and is not clipped at a timing when the base-emitter diode of the transistor Q0 is turned OFF (positive amplitude), due to the nonlinearity of the base-emitter diode of the transistor Q0. Therefore, a direct current offset voltage having positive polarity is generated at the bias voltage input terminal DCIN. The effect of generation of the direct current offset voltage is more significant as the power input from the radio frequency signal input terminal RFIN increases.

Moreover, the voltage amplitude of the radio frequency signal input from the radio frequency signal input terminal RFIN to the impedance circuit Z, is clipped at a timing when the base-emitter diode of the transistor QFB is turned ON (negative amplitude), and is not clipped at a timing when the base-emitter diode of the transistor QFB is turned OFF (positive amplitude), due to the nonlinearity of the base-emitter diode of the transistor QFB. Therefore, a direct current offset voltage having positive polarity is generated at the bias voltage input terminal DCIN. In the impedance circuit Z, the direct current offset voltage caused by the radio frequency signal output fed back from the collectors of the transistors Q1 to Qn and the direct current offset voltage caused by the radio frequency signal input from the radio frequency signal input terminal RFIN are present and are superposed.

Figure 13:
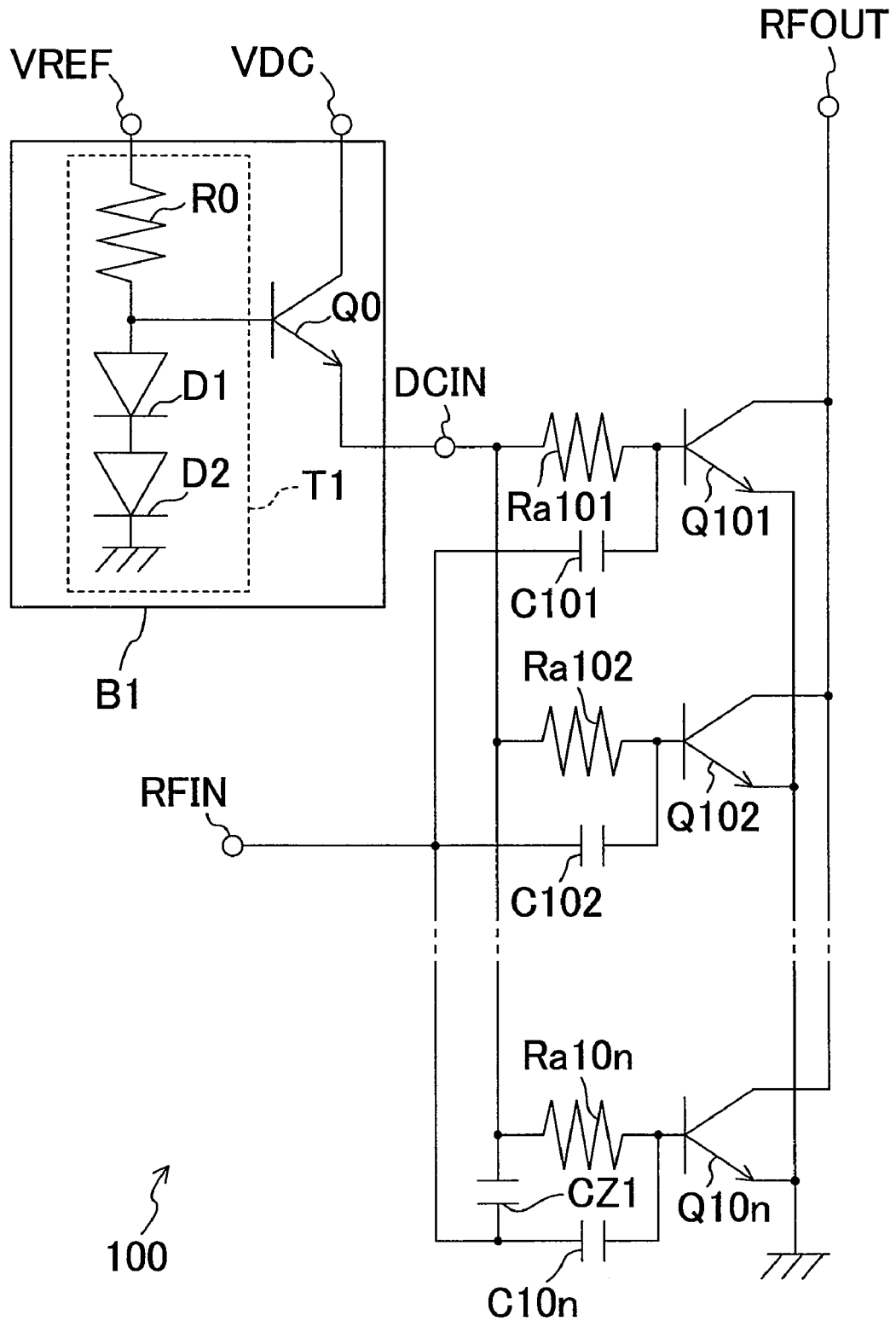
FIG. 13 is a diagram showing a circuit configuration of a conventional radio frequency power amplifier.

Next, a difference in effect between the radio frequency power amplifier 1 of Embodiment 1 (FIG. 1) and the conventional radio frequency power amplifier 100 (FIG. 13) will be described with reference to FIGS. 2 to 5. Here, it is assumed that, in the radio frequency power amplifier 1 of Embodiment 1, the resistor RFB is 120Ω, the transistor QFB includes two transistors connected in parallel, the capacitors Ca1 to Can are each 0.64 pF, the capacitors C1 to Cn are each 0.16 pF, the number of the transistors Q1 to Qn connected in parallel is 78 (n=78), the number of the resistors Ra1 to Ran connected in parallel is 78 (n=78), the number of the capacitors Ca1 to Can connected in parallel is 78 (n=78), and the number of the capacitors C1 to Cn connected in parallel is 78 (n=78).

Figure 2:
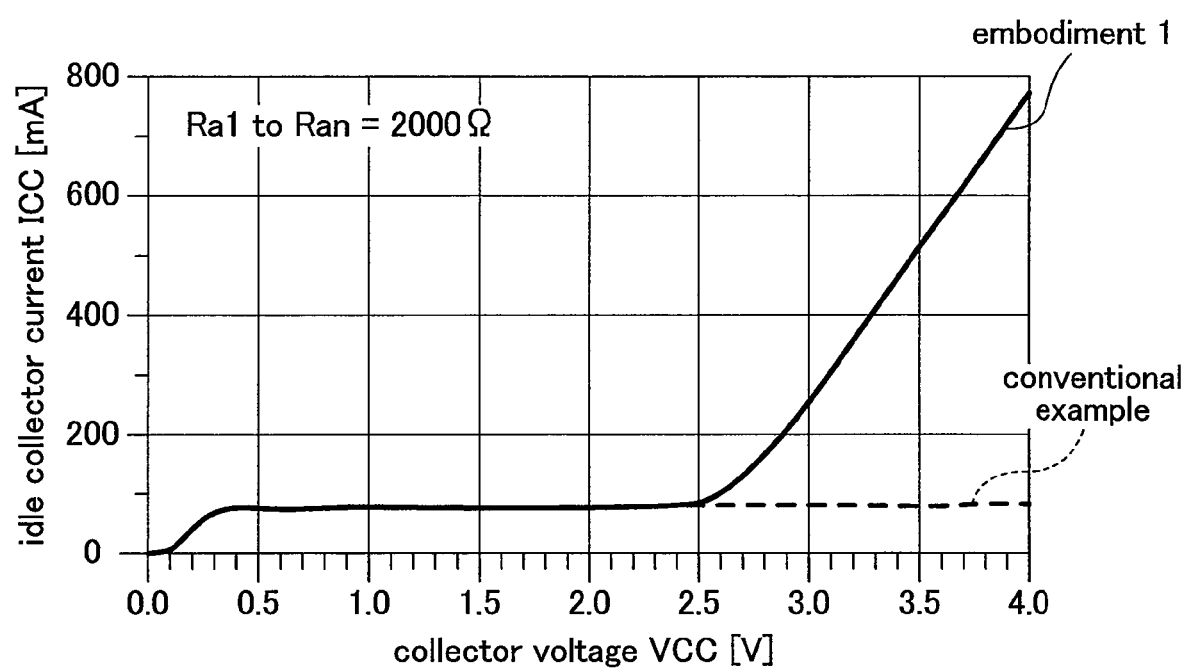
FIG. 2 is a diagram a relationship between a collector voltage and an idle collector current of an output transistor in the radio frequency power amplifier of FIG. 1 in comparison with a conventional example.

FIG. 2 is a diagram showing an idle collector current ICC where the resistors Ra1 to Ran are each 2000Ω and a collector voltage VCC of the transistors Q1 to Qn is variable. As can be seen from FIG. 2, the conventional radio frequency power amplifier 100 exhibits collector current characteristics in which, when a bias current is supplied from the bias circuit B1 to cause the collector voltage VCC to be 0.5 V or more, the idle collector current ICC is substantially constant at about 80 mA.

On the other hand, the radio frequency power amplifier 1 of Embodiment 1 similarly exhibits collector current characteristics in which, when a bias current is supplied from the bias circuit B1 to cause the collector voltage VCC to be about 0.5 V to about 2.5 V, the idle collector current ICC is substantially constant at about 80 mA. When the collector voltage VCC is about 2.5 V or more, a potential difference between the base and emitter of the diode of the transistor QFB is larger than 1.2 V (the HBT made of GaAs is in the ON state when the base-emitter voltage is 1.2 V or more), so that the transistor QFB is in the ON state, and therefore, a bias current is supplied from the collectors of the transistors Q1 to Qn via the resistor RFB and the transistor QFB, in addition to the supply of the bias current from the bias circuit B1. Therefore, the bias current from the bias circuit B1 is superposed by a bias current which is a forward current of the diode of the transistor QFB, so that the collector current steeply increases, which characteristics are shown in FIG. 2.

In mobile telephone terminals, the collector voltage of the radio frequency power amplifier is controlled within the range of 1.0 V to 3.35 V so as to reduce power consumption during low-output operation. On the other hand, in the radio frequency power amplifier 1 of Embodiment 1, control is performed with the collector voltage VCC which is decreased to lower than about 2.5 V, thereby making it possible to obtain as low power consumption as that of the conventional radio frequency power amplifier 100. Also, control is performed during high-output operation with the collector voltage VCC which is increased to higher than about 2.5 V, so that the transistor QFB is caused to be in the ON state to supply a direct-current bias current, and in addition, a portion of the radio frequency signal output from the collectors of the transistors Q1 to Qn is input to the base of the transistor QFB, whereby a direct current offset voltage can be generated.

Figure 3A:
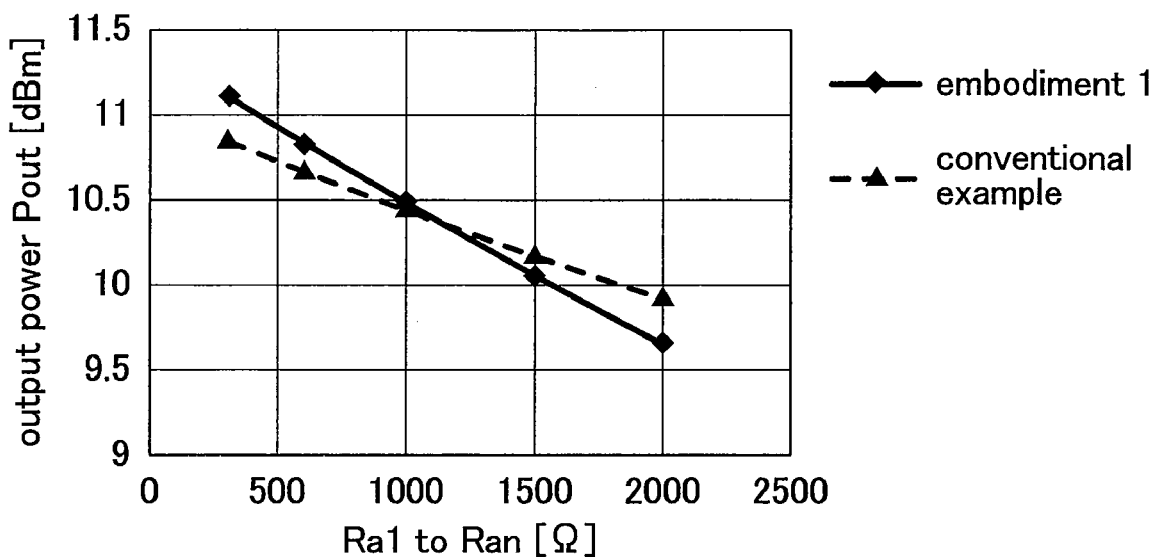
FIGS. 3A and 3B are diagrams showing characteristics during low-output operation of the radio frequency power amplifier of FIG. 1 in comparison with a conventional example.
Figure 3B:
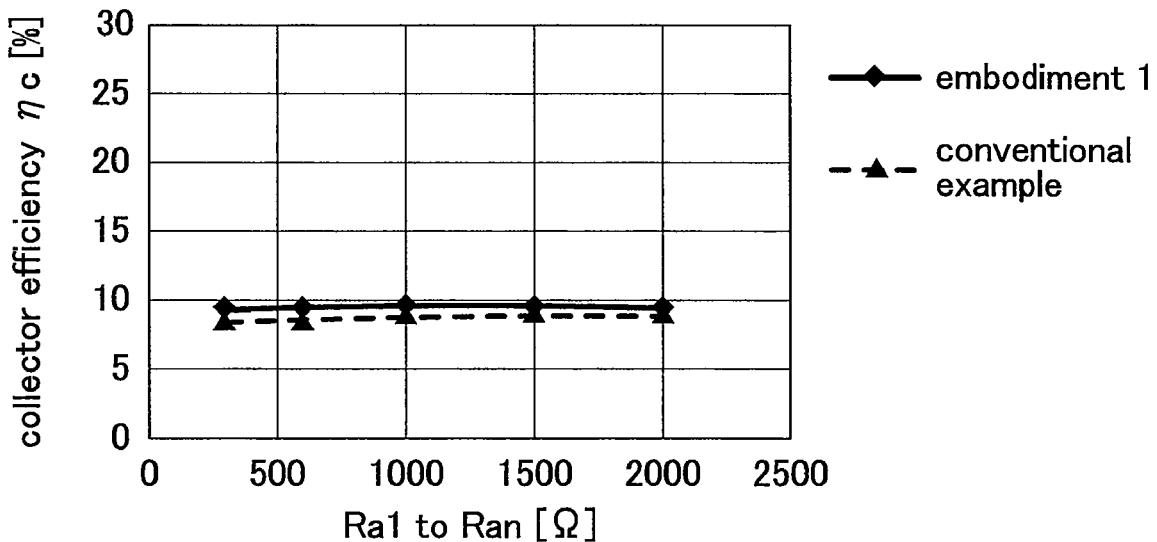

FIG. 3A is a diagram showing output power Pout where the collector voltage VCC is 1.0 V and the resistors Ra1 to Ran are variable during low-output operation (in the vicinity of +10 dBm). FIG. 3B is a diagram showing collector efficiency ηc where the resistors Ra1 to Ran are similarly variable. As can be seen from these diagrams, in the conventional radio frequency power amplifier 100, even if the resistors Ra1 to Ran are increased to 2000Ω, the characteristics are not significantly degraded (0.9 dB or less in the output power Pout, and 0.1% or less in the collector efficiency ηc). Also in the radio frequency power amplifier 1 of Embodiment 1, even if the resistors Ra1 to Ran are increased to 2000Ω, the degradation of the characteristics can be suppressed (1.4 dB or less in the output power Pout, and 0.1% or less in the collector efficiency ηc). The difference between the conventional radio frequency power amplifier 100 and the radio frequency power amplifier 1 of Embodiment 1 is as small as 0.3 dB in the output power Pout and 0.4% in the collector efficiency ηc, where the resistors Ra1 to Ran are each 2000Ω.

In this case, a base bias current is supplied only from the same bias circuit B1 both in the conventional radio frequency power amplifier 100 and in the radio frequency power amplifier 1 of Embodiment 1. In other words, also in the radio frequency power amplifier 1 of Embodiment 1, power consumption during low-output operation (in the vicinity of +10 dBm), which is important for UMTS or the like, can be maintained at substantially as low a level as that of the conventional radio frequency power amplifier 100.

Figure 4A:
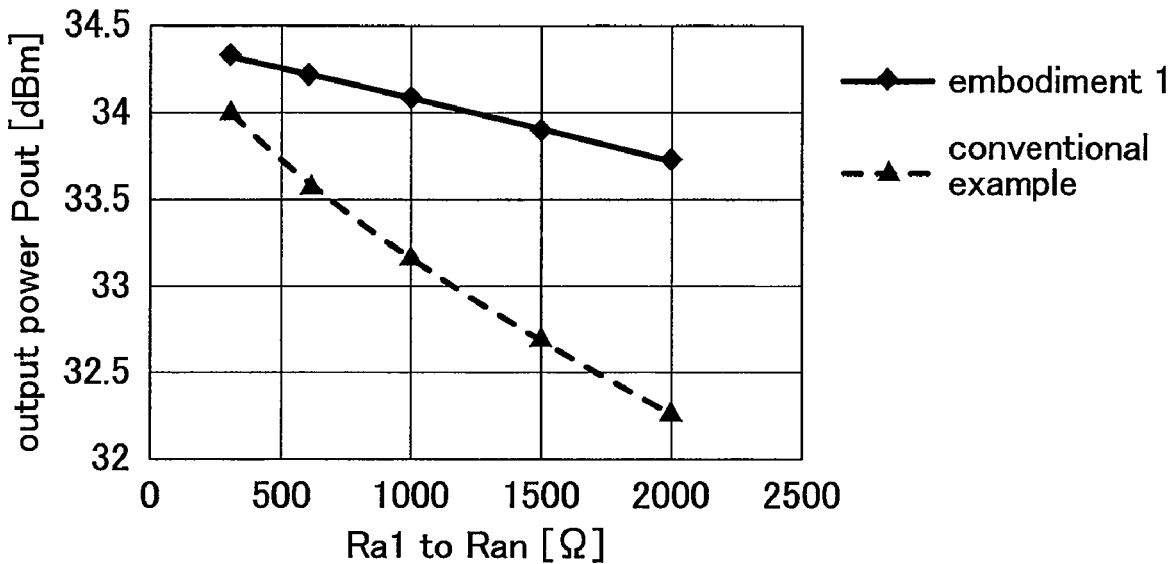
FIGS. 4A and 4B are diagrams showing characteristics during high-output operation of the radio frequency power amplifier of FIG. 1 in comparison with a conventional example.
Figure 4B:
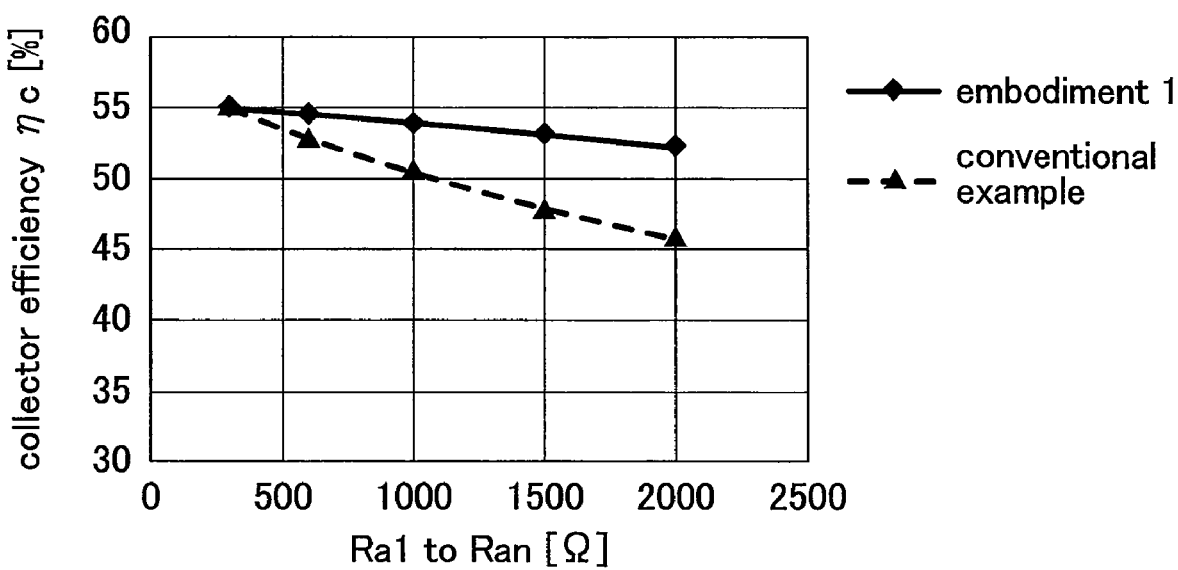

FIG. 4A is a diagram showing output power Pout where the collector voltage VCC is 3.35 V and the resistors Ra1 to Ran are variable during high-output operation (in the vicinity of +34 dBm). FIG. 4B is a diagram showing collector efficiency ηc where the resistors Ra1 to Ran are similarly variable. As can be seen from these diagrams, in the conventional radio frequency power amplifier 100, when the resistors Ra1 to Ran are increased to 2000Ω, the characteristics are significantly degraded (1.7 dB or more in the output power Pout, and 9.4% or more in the collector efficiency ηc). On the other hand, in the radio frequency power amplifier 1 of Embodiment 1, the degradation of the characteristics can be suppressed (0.6 dB or less in the output power Pout, and 3.0% or less in the collector efficiency ηc) even when the resistors Ra1 to Ran are in the vicinity of 2000Ω. Particularly, it is shown that, when the resistors Ra1 to Ran are in the vicinity of 2000Ω, the characteristics are improved by about 1.5 dB in the output power Pout and about 6.4% in the collector efficiency ηc as compared to the conventional radio frequency power amplifier 100.

In this case, the supply of the base bias current in the radio frequency power amplifier 1 of Embodiment 1 includes, in addition to the bias circuit B1, a bias current which is a forward current of the diode of the transistor QFB in the ON state. Therefore, as can also be seen from FIG. 2, the idle collector current ICC is as high as about 440 mA. Therefore, it is possible to relax the suppression of the base bias current due to the higher values of the resistors Ra1 to Ran.

A portion of a radio frequency signal output from the collectors of the transistors Q1 to Qn is input to the base of the transistor QFB via the resistor RFB, whereby a direct current offset voltage is generated, resulting in an increase in the base bias current. Also, a radio frequency signal input from the radio frequency signal input terminal RFIN to the bias circuit B1 generates a direct current offset voltage in the transistor Q0, resulting in an increase in the base bias current. Moreover, a radio frequency signal input from the radio frequency signal input terminal RFIN to the impedance circuit Z generates a direct current offset voltage in the transistor QFB, resulting in an increase in the base bias current. As a result, a synergistic effect obtained by simultaneously generating a direct current offset voltage both in the impedance circuit Z and in the bias circuit B1 while the direct-current bias current is set to be high, can generate a larger base bias current, and therefore, satisfactory radio frequency characteristics can be achieved even if the resistors Ra1 to Ran are set to be high.

A reason why the characteristics can be significantly improved during high-output operation in the radio frequency power amplifier 1 of Embodiment 1, is that an increase in potential at the bias voltage input terminal DCIN accompanying the output power compensates for a voltage drop in the resistors Ra1 to Ran. Moreover, it should be noted that the potential increase at the bias voltage input terminal DCIN can be utilized to increase the values of the resistors Ra1 to Ran so as to improve the uniformity of the operation of the transistors Q1 to Qn without setting the current of the bias circuit B1 during low-output operation to be high.

Figure 5:
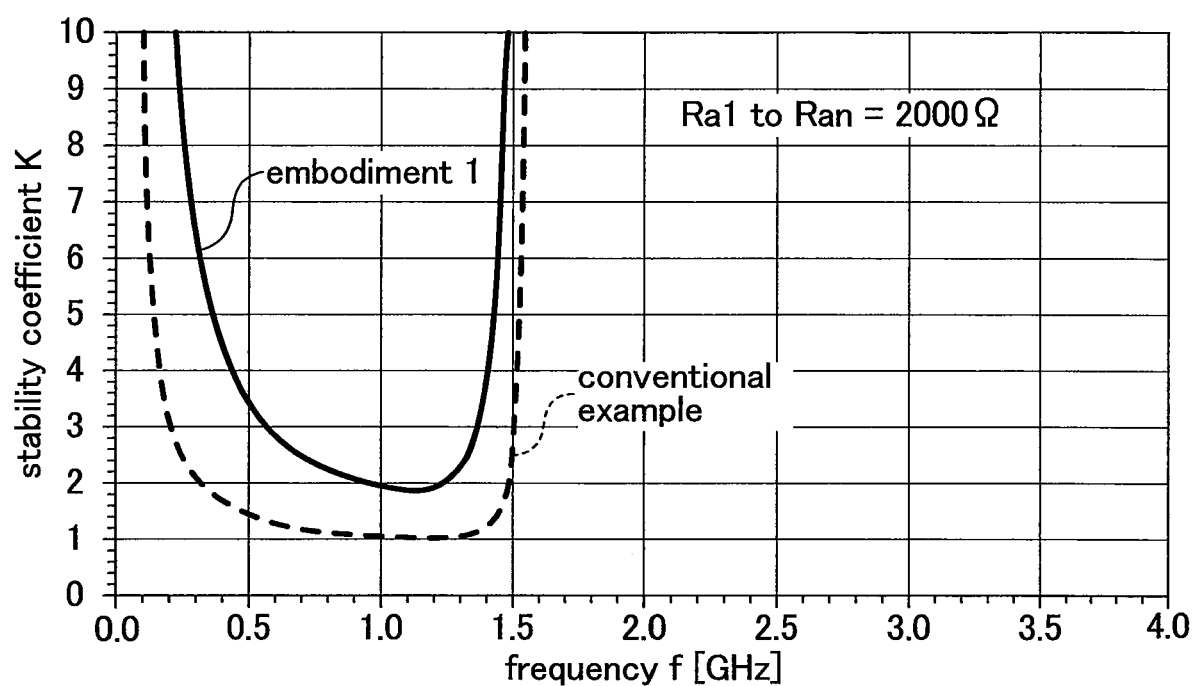
FIG. 5 is a diagram showing a relationship between a frequency and a stability coefficient of the radio frequency power amplifier of FIG. 1 in comparison with a conventional example.

FIG. 5 is a diagram showing a stability coefficient K with respect to a frequency f of the radio frequency power amplifier 1 of Embodiment 1 where the collector voltage VCC is 3.35 V and the resistors Ra1 to Ran are each 2000Ω during high-output operation (in the vicinity of +34 dBm). As can be seen from FIG. 5, whereas the stability coefficient K is 1.1 or less (unstable where K<1) within the range of 0.9 GHz to 1.4 GHz in the conventional radio frequency power amplifier 100, the stability coefficient K takes a minimum value of 1.8 in the vicinity of 1.1 GHz in the radio frequency power amplifier 1 of Embodiment 1, i.e., higher stability can be ensured. Particularly, it is shown that the stability coefficient K can be caused to be higher within a wide range of a low frequency to a radio frequency.

This is an effect which is caused by formation of a feedback loop which feeds a portion of a radio frequency signal output from the collectors of the transistors Q1 to Qn back to the bases of the transistors Q1 to Qn via the resistor RFB and the transistor QFB and the resistors Ra1 to Ran and the capacitors Ca1 to Can. Particularly, if the resistors Ra1 to Ran are increased to as high as 2000Ω, the resistors Ra1 to Ran attenuate signals passing therethrough. However, since the capacitors Ca1 to Can are provided, the dependence on the values of the resistors Ra1 to Ran can be reduced, and therefore, a sufficient stability coefficient K can be ensured irrespective of the values of the resistors Ra1 to Ran.

As described above, according to the radio frequency power amplifier 1 of Embodiment 1 of the present disclosure, the provision of the impedance circuit Z and the capacitors Ca1 to Can can simultaneously allow sufficient resistance to breakdown, and satisfactory radio frequency characteristics during high-output operation and during low-output operation.

Note that the transistors Q0, Q1 to Qn and QFB are not limited to an HBT made of a compound semiconductor (GaAs, InGaP, etc.) and may be other transistors made of Si or SiGe.

Also, it has been assumed in Embodiment 1 that a circuit in which the resistor RFB and the base-emitter diode obtained by creating a short-circuit between the base and collector of the transistor QFB are connected in series is used as the impedance circuit Z connected between the collectors of the transistors Q1 to Qn and the bias voltage input terminal DCIN. Alternatively, referring to FIG. 6, a radio frequency power amplifier 1a according to Embodiment 1a may be provided in which a circuit in which a transistor QSW and a resistor RSW connected in series are provided in addition to the resistor RFB and the transistor QFB is used as the impedance circuit Z connected between the collectors of the transistors Q1 to Qn and the bias voltage input terminal DCIN.

Figure 6:
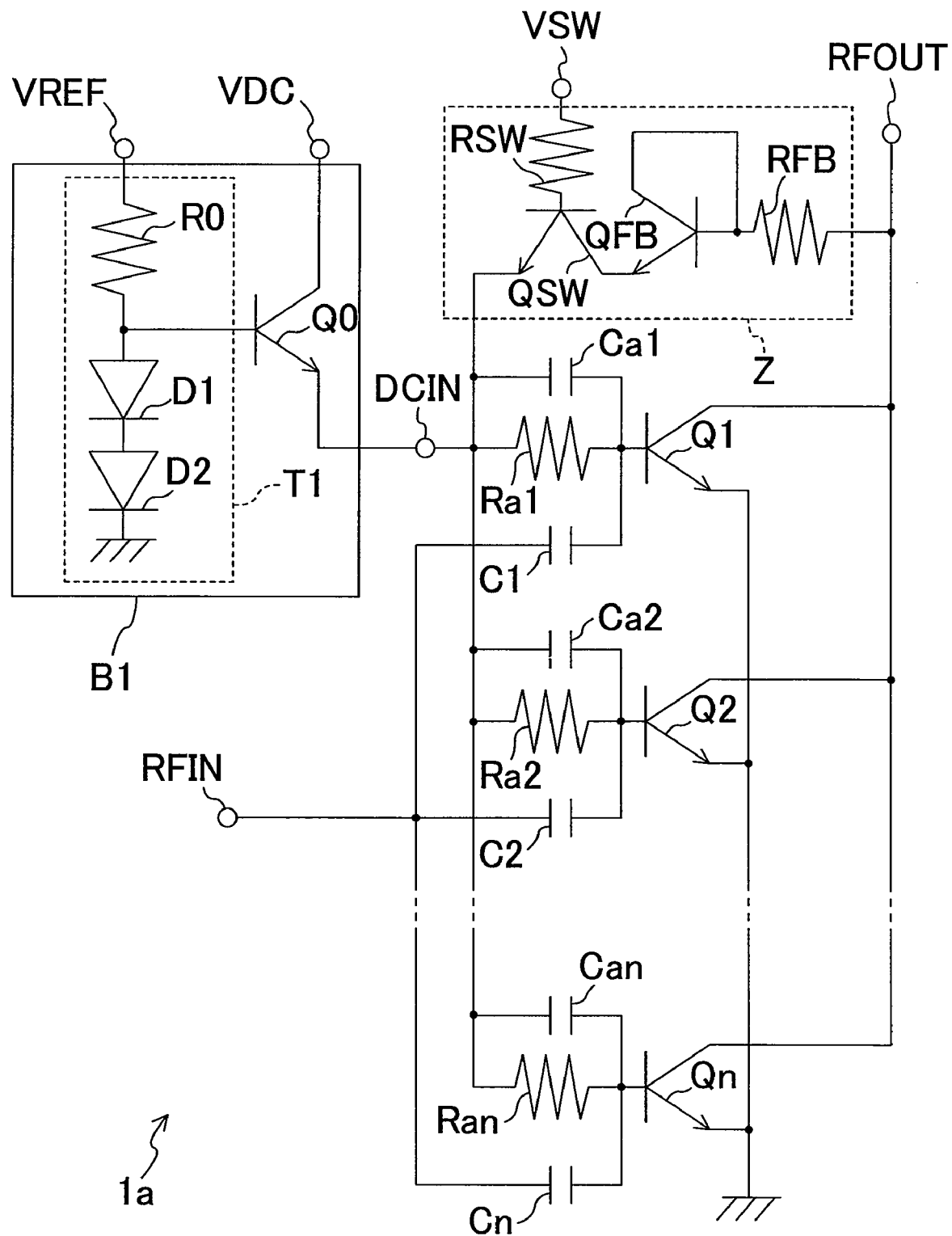
FIG. 6 is a diagram showing a circuit configuration of a radio frequency power amplifier according to Embodiment 1a of the present disclosure.
Figure 7:
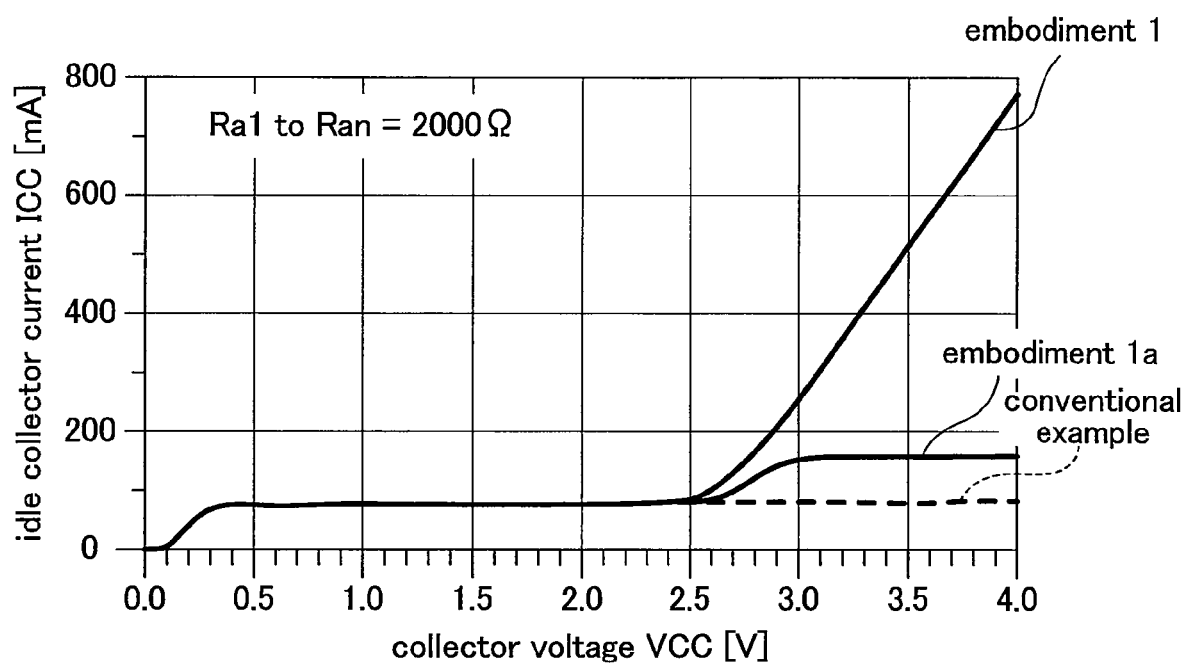
FIG. 7 is a diagram showing a relationship between a collector voltage and an idle collector current of an output transistor in the radio frequency power amplifier of FIG. 6 in comparison with Embodiment 1 and a conventional example.

FIG. 7 is a diagram showing an idle collector current ICC in the radio frequency power amplifier 1a of FIG. 6, where the resistors Ra1 to Ran are each 2000Ω and the collector voltages VCC of the transistors Q1 to Qn are variable. The radio frequency power amplifier 1a of FIG. 6 is operated under the same conditions as those of the radio frequency power amplifier 1 of FIG. 1, except that the transistor QSW includes two transistors connected in parallel, the resistor RSW is 1000Ω, a voltage of 2.6 V is applied to a power supply VSW, and the resistor RFB is changed to 60Ω. As can be seen from FIG. 7, whereas the collector current steeply and linearly increases when the collector voltage VCC is higher than 2.5 V in the radio frequency power amplifier 1 of Embodiment 1, the collector current increases to about 150 mA when the collector voltage VCC is higher than 2.5 V, however, substantially constant collector current characteristics are exhibited when the collector voltage VCC is higher than 3.0 V in the radio frequency power amplifier 1a of Embodiment 1a. This is because the forward current of the base-emitter diode obtained by creating a short-circuit between the base and collector of the transistor QFB is limited by the collector current characteristics of the transistor QSW, and therefore, a steep increase in current can be prevented when the collector voltage VCC is higher than 3.0 V.

If a sudden environmental change, erroneous operation or the like occurs in a mobile telephone terminal, a desired voltage may not be obtained from a DC-DC converter which controls the collector voltage of a power amplifier, and therefore, for example, a collector voltage of 3.35 V may be still output even during low-output operation. In this case, in the radio frequency power amplifier 1 of Embodiment 1, an idle collector current of 400 mA flows, so that unnecessary power consumption occurs. On the other hand, in the radio frequency power amplifier 1a of Embodiment 1a, since the idle collector current is relatively as low as 150 mA, even if such a situation occurs, the unnecessary power consumption can be suppressed. Thus, the radio frequency power amplifier 1a of Embodiment 1a is suitable for a case where a protection circuit or the like against an environmental change, erroneous operation or the like needs to be simplified.

Figure 8:
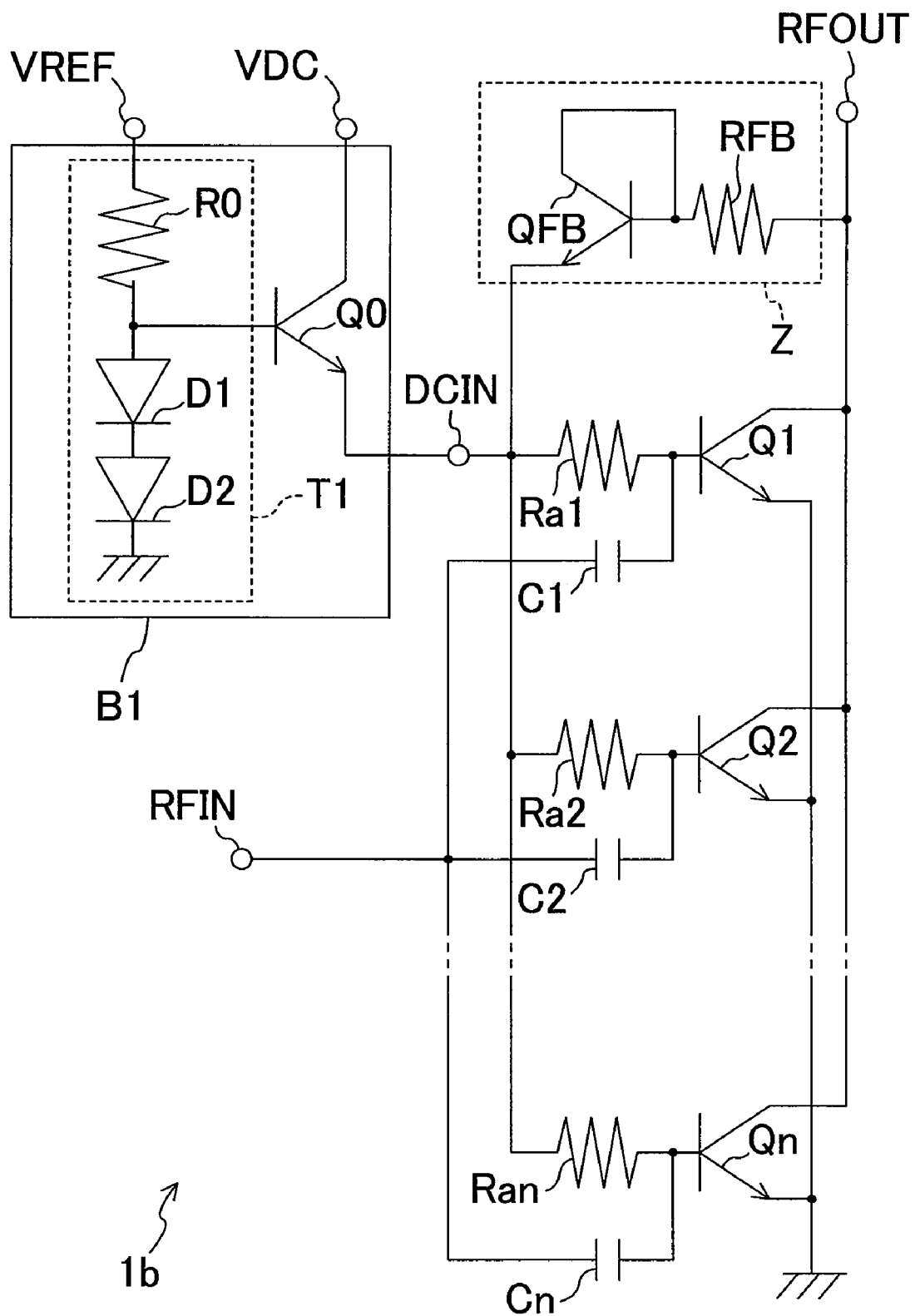
FIG. 8 is a diagram showing a circuit configuration of a radio frequency power amplifier according to Embodiment 1b of the present disclosure.

It has also been assumed in Embodiment 1 that the capacitors Ca1 to Can are connected between the bases of the respective transistors Q1 to Qn and the bias voltage input terminal DCIN and in parallel to the respective resistors Ra1 to Ran. Alternatively, referring to FIG. 8, a radio frequency power amplifier 1b according to Embodiment 1b may be provided in which only the resistors Ra1 to Ran are provided between the bases of the respective transistors Q1 to Qn and the bias voltage input terminal DCIN. In this case, a similar effect can be obtained when the output power is set to be lower (e.g., 31 dBm or less).

Figure 9:
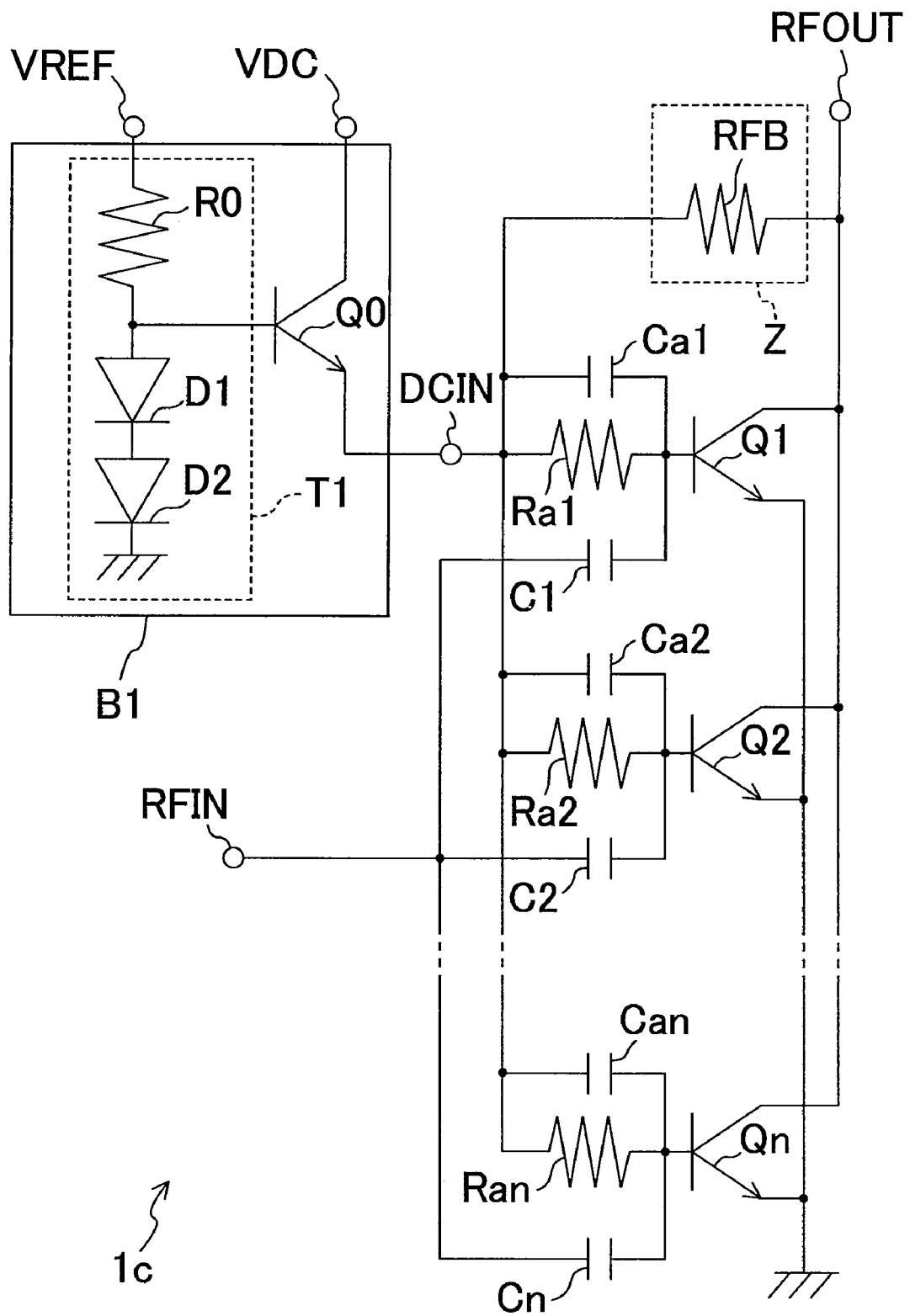
FIG. 9 is a diagram showing a circuit configuration of a radio frequency power amplifier according to Embodiment 1c of the present disclosure.

It has also been assumed in Embodiment 1 that a circuit in which the resistor RFB and the base-emitter diode obtained by creating a short-circuit between the base and collector of the transistor QFB are connected in series is used as the impedance circuit Z connected between the collectors of the transistors Q1 to Qn and the bias voltage input terminal DCIN. Alternatively, referring to FIG. 9, a radio frequency power amplifier 1c according to Embodiment 1c may be provided in which only the resistor RFB is provided is used as the impedance circuit Z connected between the collectors of the transistors Q1 to Qn and the bias voltage input terminal DCIN. In this case, a similar effect can be obtained when the output power is set to be lower (e.g., 31 dBm or less). Therefore, the radio frequency power amplifier 1c of Embodiment 1c is suitable for a case where the base bias current is continuously controlled in association with the collector voltage VCC, for example.

Embodiment 2

Figure 10:
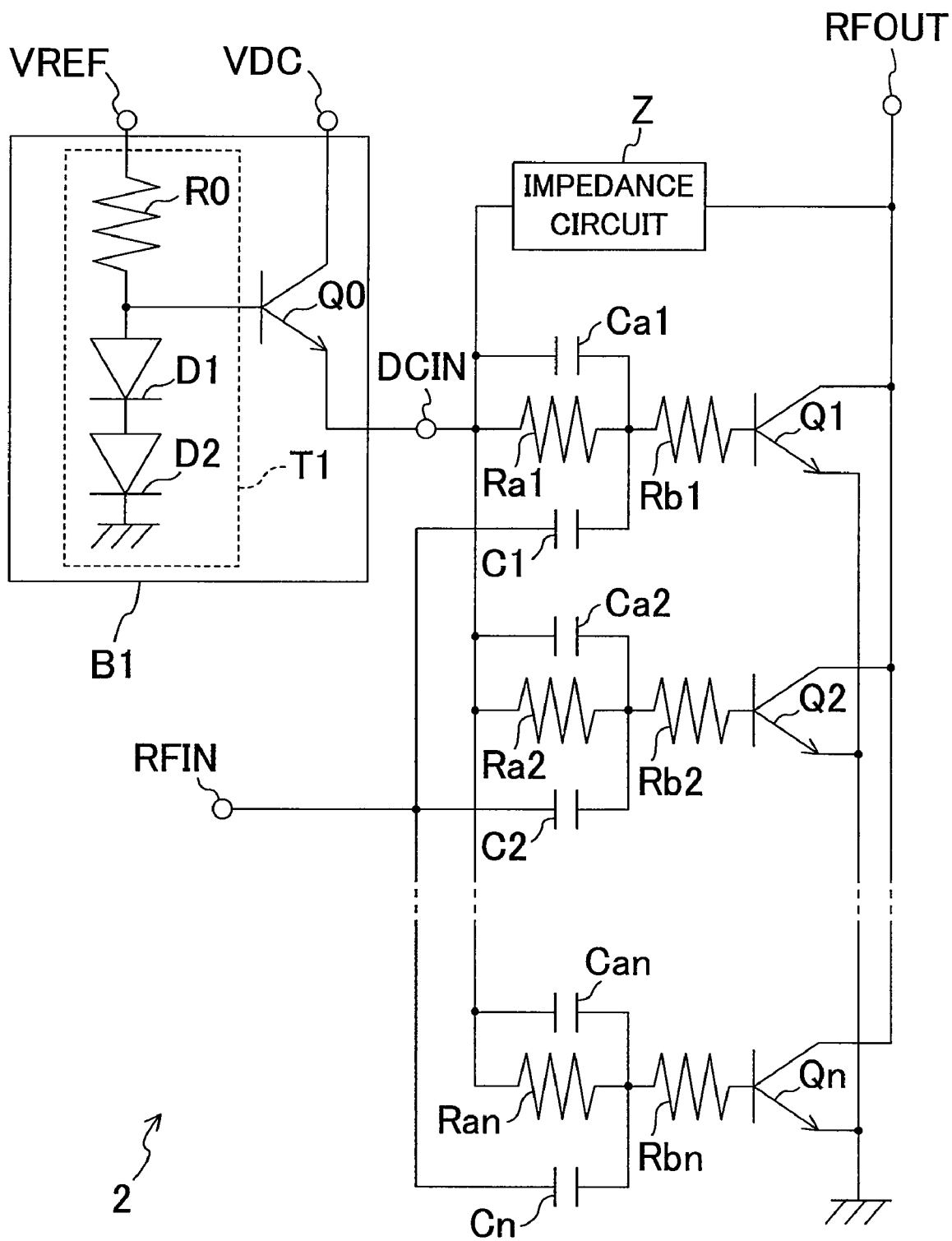
FIG. 10 is a diagram showing a circuit configuration of a radio frequency power amplifier according to Embodiment 2 of the present disclosure.

FIG. 10 is a circuit configuration of a radio frequency power amplifier according to Embodiment 2 of the present disclosure. The radio frequency power amplifier 2 of FIG. 10 includes transistors Q1 to Qn, capacitors C1 to Cn, resistors Ra1 to Ran, capacitors Ca1 to Can, resistors Rb1 to Rbn, and an impedance circuit Z. As can be seen from FIG. 10, the radio frequency power amplifier 2 of Embodiment 2 has a configuration which is obtained by adding the resistors Rb1 to Rbn to the radio frequency power amplifier 1 of Embodiment 1.

The resistors Rb1 to Rbn each take a small resistance value and are coupled between connection points of the capacitors C1 to Cn, the resistors Ra1 to Ran and the capacitors Ca1 to Can, and the bases of the transistors Q1 to Qn, respectively. Therefore, the resistors Rb1 to Rbn function as base ballast resistors for the respective transistors Q1 to Qn.

As described above, according to the radio frequency power amplifier 2 of Embodiment 2 of the present disclosure, the small resistors Rb1 to Rbn are connected to the bases of the transistors Q1 to Qn, whereby the stability of the transistors Q1 to Qn can be improved and the unnecessary oscillation thereof can be suppressed in addition to the effect of Embodiment 1.

Embodiment 3

Figure 11:
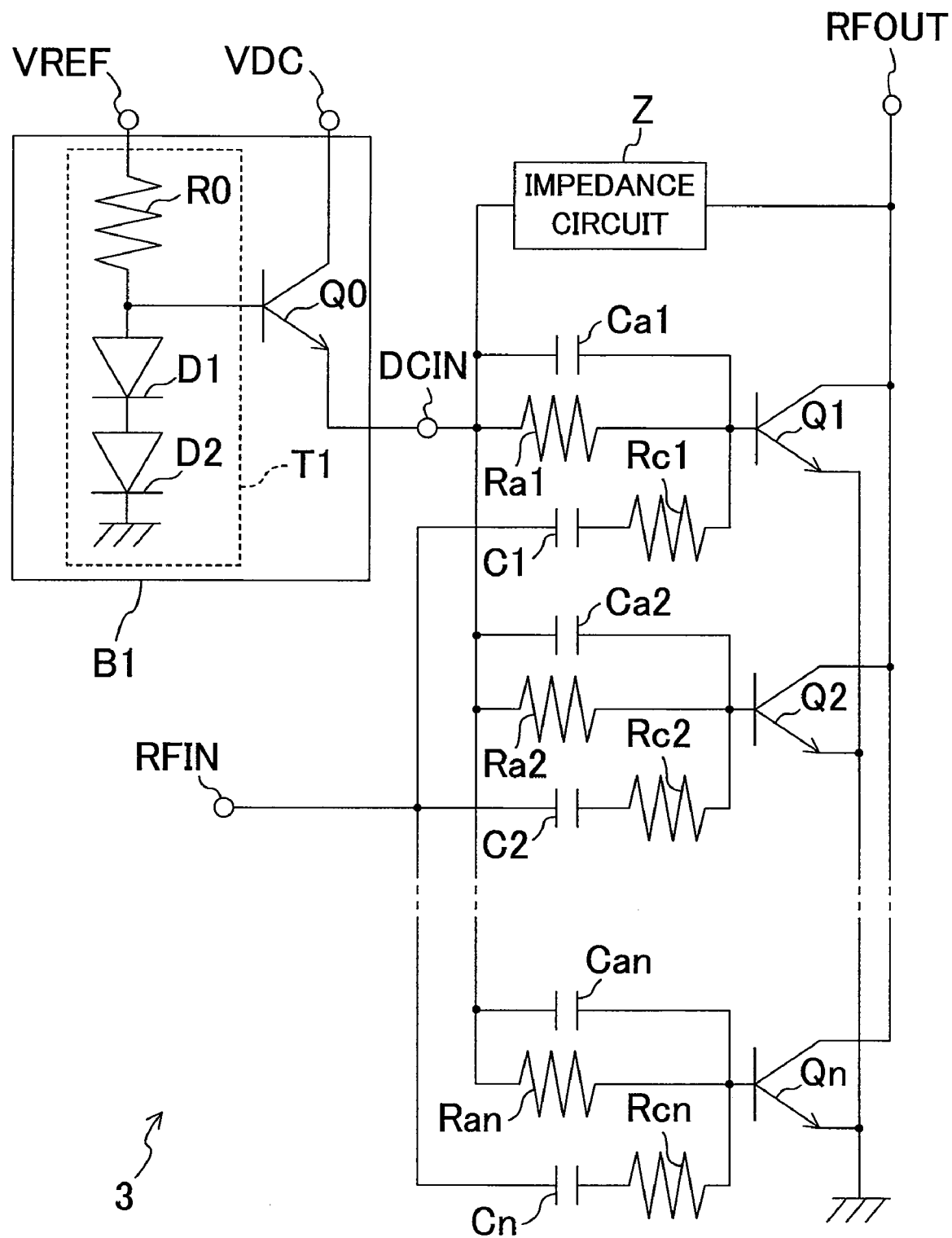
FIG. 11 is a diagram showing a circuit configuration of a radio frequency power amplifier according to Embodiment 3 of the present disclosure.

FIG. 11 is a diagram showing a circuit configuration of a radio frequency power amplifier according to Embodiment 3 of the present disclosure. The radio frequency power amplifier 3 of FIG. 11 includes transistors Q1 to Qn, capacitors C1 to Cn, resistors Ra1 to Ran, capacitors Ca1 to Can, resistors Rc1 to Rcn, and an impedance circuit Z. As can be seen from FIG. 11, the radio frequency power amplifier 3 of Embodiment 3 has a configuration which is obtained by adding the resistors Rc1 to Rcn to the radio frequency power amplifier 1 of Embodiment 1.

The resistors Rc1 to Rcn each take a small resistance value, and are coupled between connection points of the resistors Ra1 to Ran, the capacitors Ca1 to Can and the bases of the transistors Q1 to Qn, and the capacitors C1 to Cn, respectively. Therefore, the resistors Rc1 to Rcn function as base ballast resistors of the respective transistors Q1 to Qn.

As described above, according to the radio frequency power amplifier 3 of Embodiment 3 of the present disclosure, the small resistors Rc1 to Rcn are connected to the bases of the transistors Q1 to Qn, whereby the stability of the transistors Q1 to Qn can be improved and the unnecessary oscillation thereof can be suppressed in addition to the effect of Embodiment 1.

Embodiment 4

Figure 12:
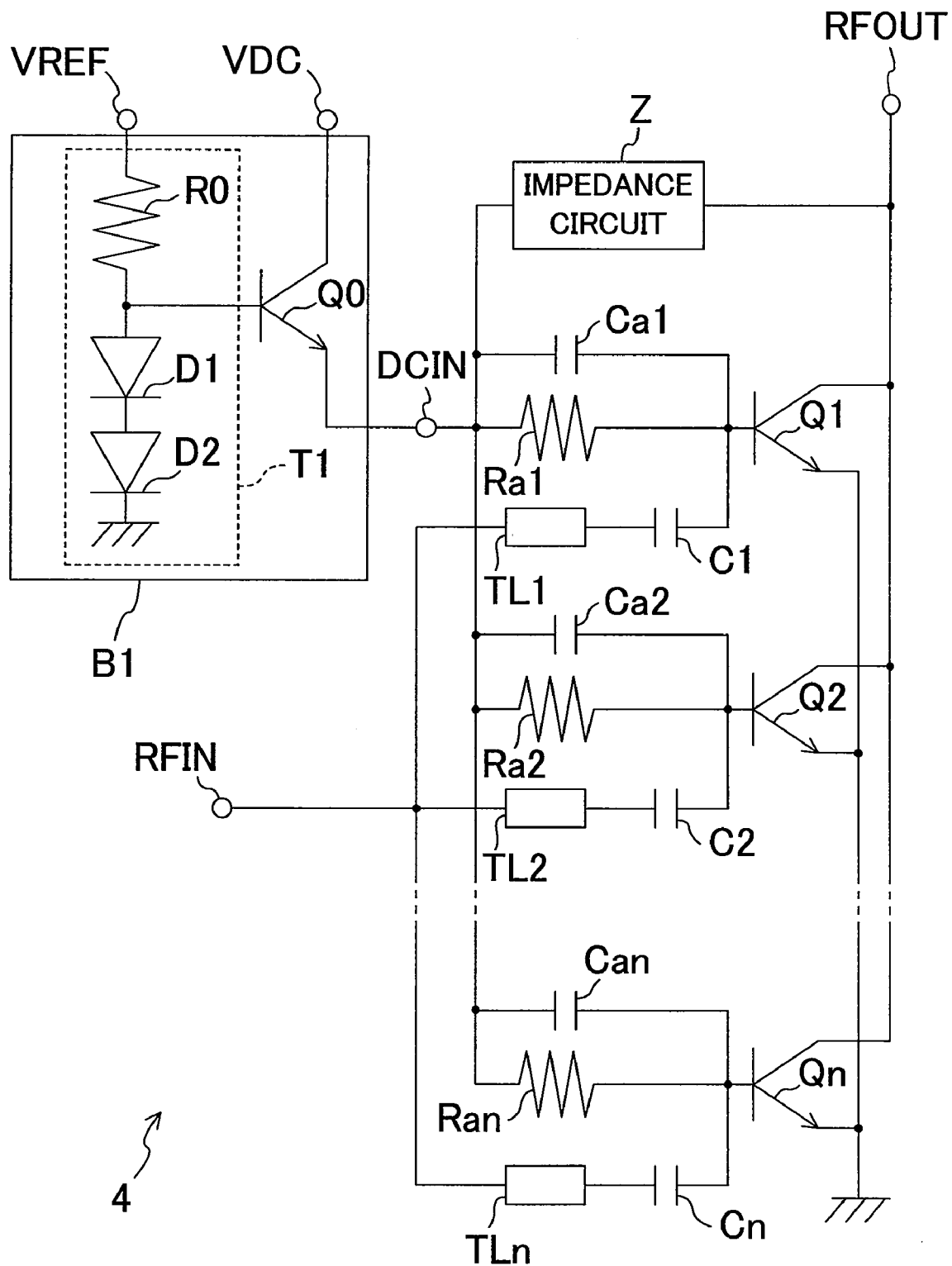
FIG. 12 is a diagram showing a circuit configuration of a radio frequency power amplifier according to Embodiment 4 of the present disclosure.

FIG. 12 a diagram showing a circuit configuration of a radio frequency power amplifier according to Embodiment 4 of the present disclosure. The radio frequency power amplifier 4 of FIG. 12 includes transistors Q1 to Qn, capacitors C1 to Cn, resistors Ra1 to Ran, capacitors Ca1 to Can, transmission line paths TL1 to TLn, and an impedance circuit Z. As can be seen from FIG. 12, the radio frequency power amplifier 4 of Embodiment 4 has a configuration which is obtained by adding the transmission line paths TL1 to TLn to the radio frequency power amplifier 1 of Embodiment 1.

The transmission line paths TL1 to TLn are coupled between the radio frequency signal input terminal RFIN and the respective capacitors C1 to Cn. The transmission line paths TL1 to TLn are resistance components which occur due to wiring between elements when the circuit of the radio frequency power amplifier 4 is actually mounted on a semiconductor chip. The transmission line paths TL1 to TLn and the capacitors C1 to Cn cause self-resonance, which decreases the impedances between the radio frequency signal input terminal RFIN and the bases of the transistors Q1 to Qn.

Therefore, a radio frequency signal is more easily passed therethrough, whereby radio frequency characteristics, such as power gain or the like, can be improved. Note that typical resistors may be used instead of the transmission line paths TL1 to TLn.

As described above, according to the radio frequency power amplifier 4 of Embodiment 4 of the present disclosure, the radio frequency characteristics can be further improved by effectively utilizing the transmission line paths TL1 to TLn. Moreover, when the radio frequency characteristics are the same, the areas of the capacitors C1 to Cn can be reduced, thereby contributing to a reduction in chip size.

Note that the components of the aforementioned embodiments may be combined in any manner that does not depart the scope of the present disclosure. For example, Embodiments 2 to 4 are obviously applicable to the configuration of FIG. 6 in which a circuit in which the transistor QSW and the resistor RSW are connected in series is provided as the impedance circuit Z, the configuration of FIG. 8 in which only the resistors Ra1 to Ran are provided between the bases of the transistors Q1 to Qn and the bias voltage input terminal DCIN, and the configuration of FIG. 9 in which the resistor RFB alone is provided as the impedance circuit Z.

Moreover, in each of the embodiments above, a plurality of impedance circuits corresponding to the respective resistors Ra1 to Ran may be provided between the collectors of the respective transistors Q1 to Qn and the bias voltage input terminal DCIN.

As described above, the radio frequency power amplifier of the present disclosure is applicable as an amplifier for use in a radio communication apparatus, such as a mobile telephone or the like, and is particularly suitable for a case where it is desirable to simultaneously achieve sufficient resistance to breakdown, and satisfactory radio frequency characteristics both during high-output operation and during low-output operation.

What is claimed is:

1. A radio frequency power amplifier for power amplification of radio frequency signal, comprising:

a plurality of transistors connected in parallel and each having a grounded emitter;

a plurality of first resistors each having a first terminal and a second terminal, wherein a direct current bias voltage is commonly applied to all of the first terminals, and the second terminals are connected to bases of the respective transistors;

a plurality of first capacitors each having a first electrode and a second electrode, wherein the radio frequency signal is input to all of the first electrodes, and the second electrodes are connected to the bases of the respective transistors; and one or more impedance circuits each having a first terminal and a second terminal, wherein the direct current bias voltage is commonly applied to all of the first terminals, and the second terminals are connected to collectors of the respective transistors, wherein the impedance circuit conducts a direct-current component.

2. The radio frequency power amplifier of claim 1, further comprising:

a plurality of second capacitors each having a first electrode and a second electrode, wherein the direct current bias voltage is commonly applied to all of the first electrodes, and the second electrodes are connected to the bases of the respective transistors.

3. The radio frequency power amplifier of claim 1, wherein the impedance circuit has one or more diodes.

4. The radio frequency power amplifier of claim 3, wherein the diode is a base-emitter diode obtained by creating a short-circuit between a base and a collector of a transistor.

5. The radio frequency power amplifier of claim 1, wherein the impedance circuit has a circuit including a diode and a resistor connected in series.

6. The radio frequency power amplifier of claim 1, wherein the impedance circuit has one or more transistors connected in series.

7. The radio frequency power amplifier of claim 1, wherein the impedance circuit has one or more resistors connected in series.

8. The radio frequency power amplifier of claim 1, further comprising:
   a plurality of second resistors coupled between connection points of the second terminals of the respective first resistors and the second electrodes of the respective first capacitors, and the bases of the respective transistors.

9. The radio frequency power amplifier of claim 1, further comprising:
   a plurality of third resistors coupled between connection points of the second terminals of the respective first resistors and the bases of the respective transistors, and the second electrodes of the respective first capacitors.

10. The radio frequency power amplifier of claim 1, further comprising:
    a terminal to which the radio frequency signal is input; and
    a plurality of fourth resistors coupled between the terminal, and the first electrodes of the respective first capacitors.

11. The radio frequency power amplifier of claim 10, wherein
    the fourth resistor is formed of a transmission line path.

12. The radio frequency power amplifier of claim 1, wherein
    the one or more impedance circuits are provided corresponding to the respective first resistors.

13. The radio frequency power amplifier of claim 1, wherein
    the direct current bias voltage is supplied from a bias circuit including at least an emitter follower in an output configuration thereof.

* * * * *